United States Patent [19]

Kaneda

[11] 4,455,676

[45] Jun. 19, 1984

[54] SPEECH PROCESSING SYSTEM INCLUDING AN AMPLITUDE LEVEL CONTROL CIRCUIT FOR DIGITAL PROCESSING

[75] Inventor: Hiroyuki Kaneda, Tokyo, Japan

[73] Assignee: Nippon Electric Co., Ltd., Tokyo, Japan

[21] Appl. No.: 354,674

[22] Filed: Mar. 4, 1982

[30] Foreign Application Priority Data

Mar. 4, 1981 [JP] Japan .................................. 56-30858

[51] Int. Cl.³ ................................................ H03G 7/00

[52] U.S. Cl. ...................................... 381/106; 381/108

[58] Field of Search .................. 340/347 AD; 381/71, 381/107, 108, 106

[56] References Cited

U.S. PATENT DOCUMENTS 3,187,323 6/1965 Flood et al. ................ 340/347 AD 4,016,557 4/1977 Zitelli et al. ................ 340/347 AD 4,070,709 1/1978 Roberts et al. .............. 179/15 A X

*Primary Examiner*—A. D. Pellinen

*Assistant Examiner*—James L. Dwyer

*Attorney, Agent, or Firm*—Sughrue, Mion, Zinn, Macpeak and Seas

[57] ABSTRACT

A speech processor having microprocessor control of the amplitude level of input speech signals. Input speech signals are applied to a digitally controlled level regulator, the output of which is converted into a digital speech signal for further speech processing. The peak level of the digital speech signals over a frame period is compared in the microprocessor with a preset optimum range. If the peak level falls outside the optimum range, control signals for the level regulator are adjusted in a direction to change the amplification/attenuation amount of the level regulator to bring the peak level within the optimum range.

5 Claims, 5 Drawing Figures

FIG. 1
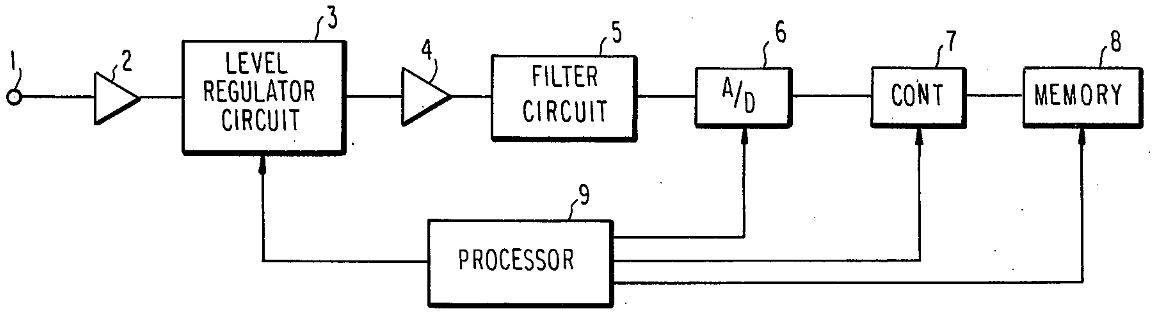
FIG. 2
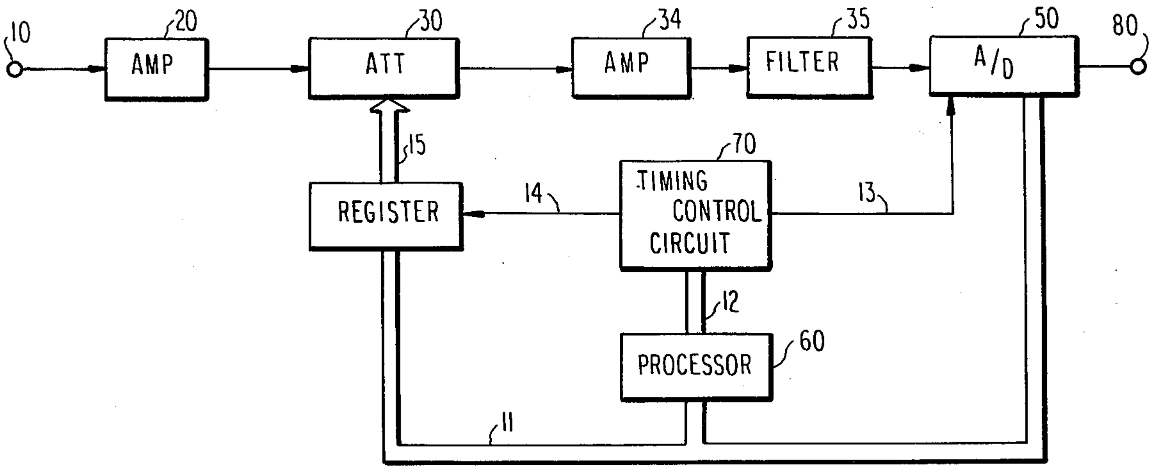
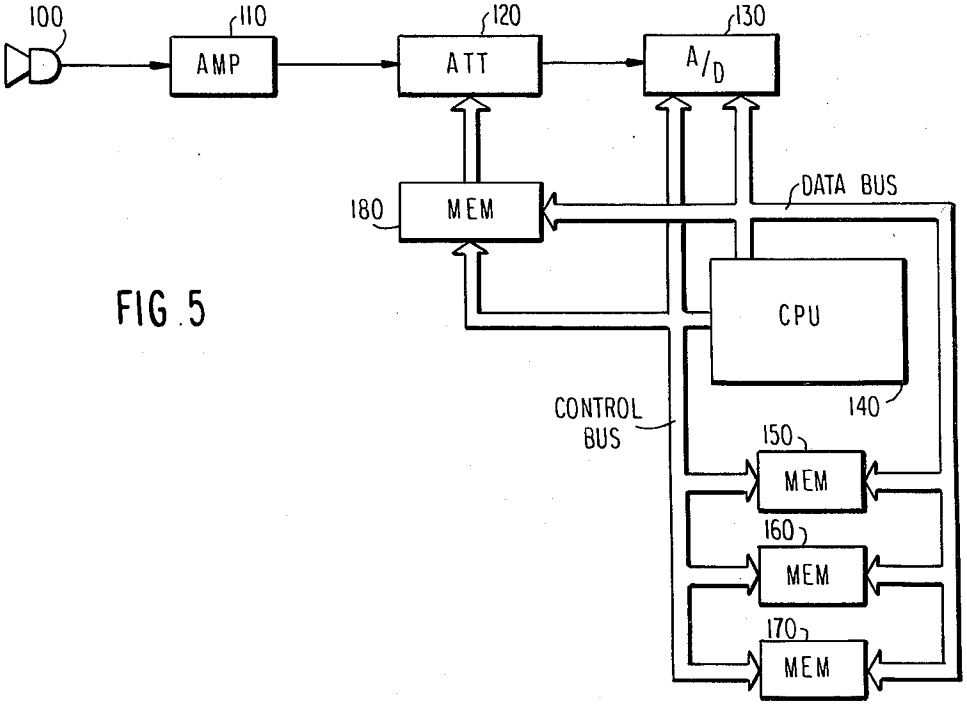
FIG. 5

SPEECH PROCESSING SYSTEM INCLUDING AN AMPLITUDE LEVEL CONTROL CIRCUIT FOR DIGITAL PROCESSING

The present invention relates to a speech processing system, and more particularly to a speech processing system including an amplitude level control circuit. The control circuit may be used to obtain digital information from a speech signal for speech recognition, speech analysis, speech synthesis, etc.

In the field of speech processing, it is necessary to control or regulate the amplitude level of a speech signal to an optimal value for subsequent speech processing. For instance, in the case where the speech signal is to be processed by a digital processing apparatus, an analog speech signal must be quantized into digital data having a predetermined number of bits. In the quantization operation, normalization of the speech signal is effected by regulating the amplitude level so as to keep the highest amplitude level within a predetermined range. As a practical example of use of the amplitude regulator, in the speech analysis operation for speech recognition, sampling processing of an amplitude level of a speech signal input from a receiver is well known. Further, in the speech synthesis operation, establishment of an amplitude level of a speech signal to be synthesized and correction of an amplitude level of a synthesized speech signal are also known. As the amplitude regulator in the prior art, a variable register circuit and an automatic gain control circuit in which an output signal from an amplifier is fed back to an input side thereof to control a degree of amplification have been used. However, the former is not suitable for automatic control because a manual operation is necessary to set a desired resistance value. Also, the latter is not suitable for digital processing, and especially has the shortcoming that program control by making use of a microprocessor is difficult. Moreover, cancellation of noise appearing temporarily or for a long period of time is impossible. As described above, it was very difficult to control the amplitude level of a speech signal to an optimal value in the speech processing system in the prior art. In addition to this level control, noise cancelling is further important in order to recognize or synthesize a speech signal correctly in a real time.

It is therefore one object of the present invention to provide a speech processing system including a level regulating or controlling circuit which can easily achieve the regulation or adjustment of an amplitude level of a speech signal suitable for digital processing.

Another object of the present invention is to provide a speech processing system with a novel function which can eliminate noise components from a speech signal.

Still another object of the present invention is to provide a speech processing system which can regulate or adjust the amplitude of a speech signal by means of a microprocessor.

A speech processing system of the present invention has a level regulator section which includes a first circuit portion regulating an amplitude level of a speech signal at a given rate, a second circuit portion comparing an amplitude level of an output signal from the first circuit portion with a preset amplitude level, a third circuit portion producing a control signal which designates a regulation rate on a basis of the result of comparison, and a fourth circuit portion applying the control signal to the first circuit portion to set the given rate to the regulation rate.

According to the present invention, there is no need to intentionally control the regulation rate for regulating the amplitude level of the speech signal from outside of the system but the regulation rate is automatically determined within the system. Therefore, the level regulation can be achieved easily at a high speed or at a real time. Moreover, since provision is made such that comparison is effected for the preset amplitude and the amplitude of an output signal from the first circuit portion and the regulation rate is determined on the basis of the result of comparison, optimal level adjustment can be achieved by means of digital processing apparatus, for example a microprocessor.

Further, since the system has the level regulator section, speech signal processing such as recognition can be available for various kinds of speech signals which are not limited to a speech signal registered preliminarily in the system. Therefore, once a speech signal is registered, reregistration is not necessary so far as words of these speech signals are the same.

Furthermore, even if the speech signal to be processed is introduced together with temporal or continuous noise, a level regulation operation is not affected by the noise. Namely the system processes the speech signal in the same manner as in the case of a noise free speech signal.

The above-mentioned and other objects, features and advantages of the present invention will become more apparent by reference to the following description of preferred embodiments of the invention taken in conjunction with the accompanying drawings, wherein:

FIG. 1 is a block diagram showing a speech recognition system to which the present invention is adapted;

FIG. 2 is a block diagram of a main portion of one preferred embodiment of the present invention which includes a level regulator section;

FIG. 5 is a block diagram showing one example of a more detailed construction of the level regulator section and related circuitry shown in FIG. 2.

Figure 3:
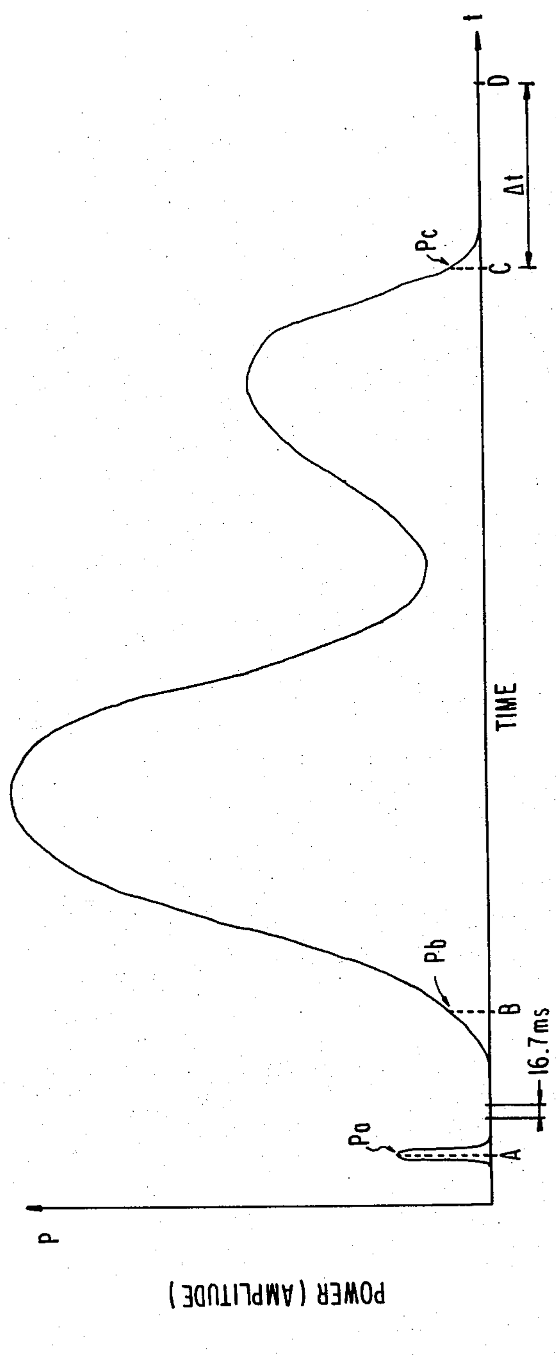
FIG. 3 is a power waveform diagram of a speech signal received under a noiseless environmental condition.

Referring now to FIG. 1, an essential part of a speech processing system to which the present invention is applied, is illustrated in a block form. However, it should be apparent that, while the illustrated example relates to a speech recognition system, the present invention is applicable to other systems such as a speech analyzer, a speech synthesizer, etc.

In FIG. 1, a speech signal (analog signal) input to the system from a microphone, tape recorder or the like is applied via an input terminal 1 to an amplifier 2, which amplifies the input speech signal to a predetermined level. Thereafter the signal is fed to a level regulator circuit 3. In this level regulator circuit 3, the amplitude level of the speech signal is amplified to be adjusted or regulated to a level optimal to an analog-digital conversion (the optimal value depends on the number of bits of the converted digital signal to be digitally processed in the system). Further the adjusted speech signal is transferred through a gain-control amplifier 4 to a filter section 5. For example, the filter section 5 is composed of eight band-pass filters, each corresponding to one of the frequency bands in the frequency range of 150 Hz$\sim$5950 Hz and being separated from the next frequency band by intervals of $-3$ dB. The speech signals in the respective frequency bands are successively and selectively derived from the corresponding filters. The speech signals passed through the respective filters are converted into digital signals, respectively (by an A/D converter 6). Predetermined digital processing is executed in a control section 7. The result of the processing is stored in a memory 8.

Thus, the input speech signal for speech recognition is adjusted in amplitude by the level regulator circuit 3, digitized by the A/D converter 6, analyzed by the control section 7 and then set in the memory 8. Upon speech recognition processing, the digital signals set in the memory 8 are compared with those of a new input speech signal received from the terminal 1 shown in FIG. 1 to determine whether or not the speakers are the same person, or what kind of speech is being received.

It is to be noted that a sampling operation of the input speech signal and the timing control of the system shown in FIG. 1 are controlled by a microprocessor 9. For example, a sampling period of the input speech signal is preset at 16.7 ms. In other words, the input speech is sampled once for every 16.7 ms, then it is digitized to be stored in the memory 8. Although not shown in FIG. 1, if necessary, the processor 9 may achieve data transfer between the respective blocks (3, 6, 7 and 8) through a data bus.

In FIG. 1, the purpose of processing in the level regulator circuit 3 is to adjust the amplitude level of the input speech signal to an optimal value so that the respective processing blocks in the subsequent stages may easily digitize the input speech signal. The details of the adjustment procedure will be described below.

The adjustment must be executed in such a manner that among amplitudes of the input speech signal which are sampled during one frame or one speech signal, the maximum amplitude value may correspond substantially to the full scale of the 8-bit digital signal. One preferred embodiment of the present invention is illustrated in FIG. 2.

In FIG. 2, terminal 10 is an input terminal for a speech signal and corresponds to the input terminal 1 in FIG. 1. An amplifier circuit 20 is a circuit for preliminarily amplifying the input speech signal and corresponds to the amplifier 2 in FIG. 1. A level regulator circuit (ATT) 30 operates to either amplify or attenuate the input speech signal according to regulation data applied thereto from a register 40. The regulation rate determined by the regulation data set in the register 40 is designed, for example, so that a variable level change can be achieved with an increment of 1.5 dB for each bit in the register 40, up to a maximum variation of 88.5 dB. An output signal from the level regulator circuit 30 is input to an A/D converter circuit 50 through a gain control amplifier 34 and a filter 35. Further an output digital signal from the A/D converter circuit 50 appears at a terminal 80. In this arrangement, the gain-control amplifier 34 (4 in FIG. 1) may be omitted. The digital signal (of 8 bits) converted from the speech signal by the A/D converter 50 is transferred to a processor 60 through a data bus 11. The transferred digital signals are compared with data preset in a memory (ROM or RAM) provided in the processor 60. On the basis of the comparison, the next subsequent regulation rate is determined to regulate the amplitude of the input speech signal. The data corresponding to the determined regulation rate is set in the register 40 and serves as data for designating a regulation rate for the next speech signal that is input to the level regulator circuit 30. Reference numeral 70 designates a timing control circuit which senses an instruction generated from the processor 60 via an instruction bus 12 and applies a write control signal 14 to the register 40 and a conversion start signal 13 to the A/D converter 50 by decoding the instruction.

In practical operations, the processor 60 presets predetermined regulation data as the initial data (for instance, data for attenuating at a rate of $2_{(H)}=3$ dB) in the register 40 before a first speech signal is input from the terminal 10. Under this condition the first speech signal is first attenuated by 3 dB by the regulator circuit 30, and the resultant signal is converted into a digital signal by the A/D converter circuit 50. In this embodiment, the number of bits to be processed in the A/D converter 50 is 8 (bits), so that the speech signal (the output of the attenuator 30) can be digitized (or quantized) into levels represented by $OO_{(H)}\sim FF_{(H)}$ in the hexadecimal notation.

The input speech signal is sampled every 16.7 ms and each sample is quantized. All quantized sampling points are transferred to processor 60 where the peak level over a frame period is detected and compared with a preset range of peak values, e.g., a range from $AO_{(H)}=160$ to $FO_{(H)}=240$. If the peak value of the speech signal over a frame period falls within the preset range, it is assumed that the attenuation/amplification is correct, and therefore the data in register 40 is correct, and the speech signal is further determined to be a signal of the proper level for recognition.

On the other hand, if the selected peak level value is lower than $AO_{(H)}$, the processor 60 sets new regulation data in the register 40 which causes regulator 30 to amplify the input signal by an additional 1.5 dB (practically it is only necessary to increase the present contents of the register 40 by 1). As a result, a speech signal which has been further amplified by 1.5 dB is output from the level regulator circuit 30. Then, a new peak level value obtained by executing similar processing for the adjusted output speech signal is again checked to determine whether or not it falls in the range of $AO_{(H)}\sim FO_{(H)}$. Such processing is repeated until the newly obtained peak level value falls in the predetermined range. In the case where the peak level value exceeds $FO_{(H)}$, processing similar to that described above is executed to reduce the peak level value so that it may be reduced lower than $FO_{(H)}$ while successively decrementing the contents of the register 40.

As a result, the input speech signal is normalized to an optimal level for each frame, and converted into digital signals to be stored in the memory 8 (FIG. 1). As will be obvious from the above description, according to the present invention, since level regulation for a speech signal is executed automatically through a simple operation, recognition processing for a speech signal can be achieved exactly at a high speed.

It is to be noted that since speech signals vary widely depending upon the person speaking, it is desirable to provide a gain-control circuit 4 for the purpose of regulating the gain in the system, as shown in FIG. 1. It is also to be noted that, since the power of low pitch tone is dominant in the speech signal, the high pitch tone should be enlarged to keep the power of the sampled speech signal at a certain fixed value in full range of frequency.

Although in the above example the data in the register is changed in predetermined steps, it could be changed in steps of varying amounts dependent upon the difference between the peak level detected and the optimum peak level. Furthermore, if a lot of regulation data are preliminarily set in a memory table and provision is made such that an address for selecting the data in the table may be generated in response to a level difference between the output from the level regulating circuit and the optimal level, then level regulation can be achieved at a higher speed. Moreover in the case where the selected peak level value in one frame period is lower than $AO_{(H)}$, the method could be employed in which a plurality of regulation data as the correction rate are prepared and the optimal one among them is picked out. However, in the case of a peak level value exceeding $FO_{(H)}$, since it is difficult to estimate an accurate attenutation rate, it is preferable either to achieve the level adjustment step by step as is the case with the abovedescribed embodiment or to employ means for detecting the optimal correction rate while executing the level correction each time by a number of steps. In such processing, a digital attenuator may be used. It is to be noted that in the case of employing an attenuator, it is more effective for speech signals having small peak level to select an attenuation ratio larger than zero as an initial value to be preset into the system.

Further, it is apparent that as the data to be compared in the processor 60, the input signal itself could be used instead of the output signal from the level regulator circuit 30. Still further, the abovedescribed principle of the present invention is equally applicable to a speech synthesis processing system as well as a speech analysis processing system.

In the following, one practical embodiment of the present invention which best achieves the advantageous effects of the invention, will be described with reference to FIGS. 3 to 5. This embodiment is one example of a speech recognition system. This is effective even in the case where an environmental noise is introduced together with the speech signal to be recognized.

FIG. 3 is a power waveform diagram of a speech signal in the absence of environmental noise. The abscissa is a time axis and the ordinate is a speech power axis, that is, an amplitude level axis. A power (amplitude) waveform of a speech signal to be processed extends from time B to time C in this figure. FIG. 5 is a detailed block diagram of a level regulator circuit and related elements. In this figure, a speech signal input through a microphone 100 is applied via an amplifier circuit 110 to a level regulator circuit 120. The speech signal applied to this circuit 120 is either amplified or attenuated on the basis of regulation data stored in a memory 180, and then it is transferred to an A/D converter circuit 130. The digital signal obtained by A/D conversion is sent to a CPU 140 and memories 150∼170. In this arrangement, data for determining whether the speech signal should be input or not, are preliminarily set in the memory 150. This determination depends upon whether a total sum of the speech signal at six consecutive sampling points (sampling time is 16.7 ms) exceeds a predetermined value or not. For instance, a hexadecimal value $(350)_H$ is set in the memory 150. The starting point of the speech signal is determined by the value set in memory 160. For example if the value set in memory 160 is the hexadecimal value $(60)_H$, the starting point will be the first sample exceeding $(60)_H$ and being within the six sample group whose total power exceeds $(350)_H$. The end point of the speech signal is determined by the value set in memory 170, e.g., hexadecimal value $(70)_H$. The end point is detected when ten consecutive samples have a level of $(70)_H$ or less. As noted previously, in the memory 180 are set the regulation data. For instance, the data "O" corresponds to nonattenuation, and each time the data is incremented by one, the attenuation ratio is increased by −1.5 dB. For instance, if the memory 180 is formed of a 6-bit register, 64 steps of regulation data can be set therein. It is preferable in practical use that the initial value of the regulation data is set at "2.

Referring back to FIG. 3, the speech signal processed by the above circuit is the signal between B and C. Noise pulses, such as that shown at A will not be processed because it does not satisfy the requirement of six consecutive samples having a total power exceeding $(350)_H$. In this manner the system acts to cancel or be immune to noise.

Figure 4:
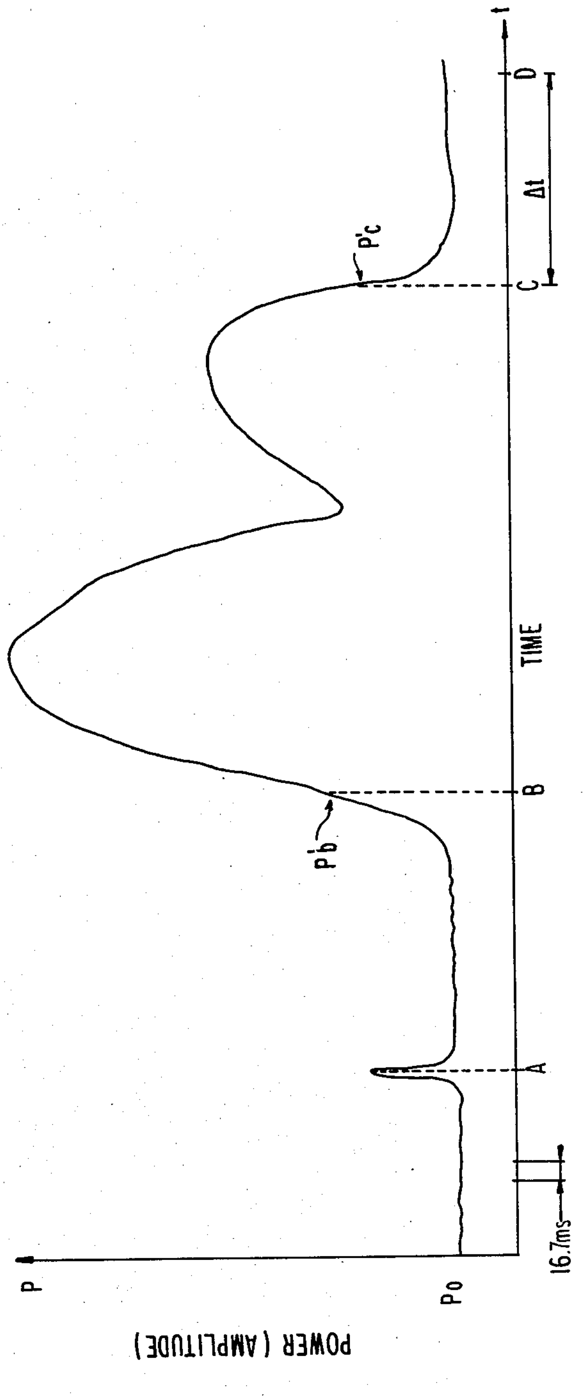
FIG. 4 is a power waveform diagram of a speech signal received under a noisy environmental condition.

Next, description will be made for the case where the input signal involves continuous noise such as environmental (background) noise as shown in FIG. 4. In this case, the environmental noise is first received from the microphone 100 under the initial condition of the system. The noise level $P_o$ is detected by the CPU140 and the data to be set in the memories 150∼170, respectively, are changed depending upon this noise level $P_o$. According to the above-assumed example, the amended data in the memory 150 is $350+(P_o\times 6)$, the amended data in the memory 160 is $50+Po$, and the amended data in the memory 170 is $70+P_o$.

After the data in the memories 150, 160 and 170 are amended, a speech signal of one word is input through the microphone 100, and a peak level in one frame of the input speech signal is regulated to an optimal value for A/D conversion. Here it is assumed that $FO_{(H)}$ and $AO_{(H)}$ have been set as upper and lower limit values, respectively, of the optimal range of the peak level. If a peak value $P_p$ detected from the input speech signal is larger than $FO_{(H)}$, the data set in the memory 180 is increased by one. Whereas, if the detected peak value $P_p$ is smaller than $AO_{(H)}$, the data set in the memory 180 is decreased by one. Furthermore, if the detected peak value is smaller than $80_{(H)}$, the data set in the memory 180 is decreased by two. In this way, when the condition of $FO_{(H)}\geqq P_p\geqq AO_{(H)}$ has been established, the regulation is completed.

By employing the above-described regulation, even if there is significant environmental noise, the recognition process is easily modified taking the noise into account. Accordingly, correct speech recognition can be executed under any environmental condition.

What is claimed is:

1. A speech processing system comprising:

an input circuit for receiving a speech signal and an environmental noise signal;

an analog-digital converter circuit for converting an analog value of said speech signal and said environmental noise signal to a digital value at a plurality of sampling points to produce a digital speech signal;

a regulating circuit coupled between said input circuit and said analog-digital converter circuit for regulating the amplitude of said speech signal to an optimal level in accordance with regulation data;

a memory having a first memory portion, a second memory portion and a third memory portion, said first memory portion storing first digital data for determining whether said speech signal should be input or not, said second memory portion storing second digital data for determining a start of said speech signal, and said third memory portion storing third digital data for determining an end of said speech signal; and a control circuit coupled to said analog-digital converter circuit, said regulating circuit and said memory and having a detecting portion for detecting the noise level of said environmental noise signal received by said input circuit, a changing portion for adding a digital value corresponding to said noise level of said environmental noise signal to said first, second and third digital data to change said first, second and third digital data, respectively, a producing portion for producing said regulation data in response to said digital speech signal produced by said analog-digital converter circuit, a comparing portion for comparing said speech signal regulated to an optimal level by said regulating circuit with the changed first, second and third digital data, respectively, and a recognizing portion for recognizing the speech signal to be processed when the total sum in digital values of digital speech signals converted at a plurality of successive sampling points is larger than said changed first digital data.

2. A speech processing system as claimed in claim 1, in which the recognized speech signal to be processed has a starting analog value whose converted digital value is larger than said second digital data and an ending analog value whose converted digital value is smaller than said third digital data.

3. A speech processing system comprising:

means for receiving an input signal having a speech signal and a noise signal;

means for regulating the amplitude of said input signal to an optimal level;

means coupled to said regulating means for digitalizing the regulated input signal at a plurality of sampling points;

memory means for storing digital data for determining whether a speech signal should be input or not;

detecting means coupled to said digitalizing means and said memory means for detecting an input of said speech signal by selecting only such an input signal that a total sum in digital values of its digitalized signal at a plurality of successive sampling points is larger than said digital data stored in said memory means; and means for transferring the input speech signal detected by said detecting means to a processing section.

4. A system claimed in claim 3, in which said regulating means regulates the peak level of the amplitude of said input signal received by said receiving means in a predetermined period.

5. A system claimed in claim 3, in which said detecting means cancels an input signal when the total sum in digital values of its digitalized signal at a plurality of successive sampling points is smaller than said digital data of said memory means.

* * * * *

UNITED STATES PATENT AND TRADEMARK OFFICE
CERTIFICATE OF CORRECTION

PATENT NO. : 4,455,676

DATED : June 19, 1984

INVENTOR(S) : Kaneda

It is certified that error appears in the above-identified patent and that said Letters Patent is hereby corrected as shown below:

Column 5, line 20, change "abovedescribed" to --above-described--;

line 31, change "abovedescribed" to --above-described--.

Signed and Sealed this

*Eleventh* Day of *December 1984*

[SEAL]

*Attest:*

GERALD J. MOSSINGHOFF

*Attesting Officer* *Commissioner of Patents and Trademarks*